United States Patent [19]

Baker et al.

[11] Patent Number: 4,511,201
[45] Date of Patent: Apr. 16, 1985

[54] MODULE MOUNTING ASSEMBLY

[75] Inventors: Paul A. Baker; Michael G. Strautz, both of Columbus, Ohio

[73] Assignee: AT&T Bell Laboratories, Murray Hill, N.J.

[21] Appl. No.: 628,139

[22] Filed: Jul. 10, 1984

Related U.S. Application Data

[63] Continuation of Ser. No. 439,389, Nov. 5, 1982, abandoned.

[51] Int. Cl.³ .............................................. H01R 9/09
[52] U.S. Cl. .......................... 339/75 MP; 339/17 CF
[58] Field of Search ...... 339/17 CF, 176 M, 176 MP, 339/75 M, 75 MP

[56] References Cited

U.S. PATENT DOCUMENTS

| | | | |
|---|---|---|---|
| 3,663,920 | 5/1972 | Lapham et al. | 339/17 CF |
| 3,877,064 | 4/1975 | Scheingold et al. | 339/17 CF |
| 3,940,786 | 2/1976 | Scheingold et al. | 339/17 CF |
| 4,050,755 | 9/1977 | Hasircoglu | 339/17 CF |
| 4,093,330 | 6/1978 | Pittman | 339/17 CF |
| 4,130,327 | 12/1978 | Spaulding | 339/17 CF |
| 4,142,287 | 3/1979 | Grabbe | 29/628 |
| 4,144,648 | 3/1979 | Grovender | 339/17 CF |
| 4,155,615 | 5/1979 | Zimmerman, Jr. et al. | 339/17 CF |
| 4,193,654 | 3/1980 | Hughes et al. | 339/276 SF |
| 4,220,383 | 9/1980 | Scheingold et al. | 339/17 CF |
| 4,222,622 | 9/1980 | Griffin et al. | 339/17 CF |
| 4,223,370 | 9/1980 | Quere et al. | 339/17 CF |
| 4,278,311 | 7/1981 | Scheingold et al. | 339/17 CF |
| 4,395,084 | 7/1983 | Conrad | 339/75 MP |
| 4,410,223 | 10/1983 | Baker | 339/75 M |

Primary Examiner—John McQuade
Attorney, Agent, or Firm—D. A. Marshall

[57] ABSTRACT

Apparatus for mounting an integrated circuit module (2) on a printed wiring circuit board (3). The apparatus assembly (1) comprises a ring member (13) for use in assembling a generally rectangular insulating member (11) having a plurality of electrical conducting members (10) positioned therein with a plurality of other insulating members (12) to form quadrilateral configurations of first and second contacts (101, 102) for contacting module terminals (20) and the printed wiring circuit board. A one piece cover (14) engages the ring member to spring clamp the module on the rectangular insulating member and maintain each module terminal in engagement with a corresponding first contact to electrically couple the module with the printed wiring circuit board.

30 Claims, 12 Drawing Figures

MODULE MOUNTING ASSEMBLY

This application is a continuation, of application Ser. No. 439,398, filed Nov. 5, 1982, now abandoned.

TECHNICAL FIELD

This invention relates to apparatus for mounting a module on a printed wiring circuit board. In particular it relates to an assembly for use in mounting an integrated circuit chip carrier device on a printed wiring circuit board and electrically interconnecting the device with circuitry of the circuit board.

BACKGROUND ART

Integrated semiconductor circuit devices, oftentimes referred to as chips, contain a variety of miniaturized electrical circuitry and are widely used on printed wiring circuit boards manufactured by the Electronics and Communications Industry to form larger composite electrical circuits. A typical chip is a relatively small and fragile device commonly mounted on a ceramic substrate called a chip carrier. Electrical conducting leads generally extend outwardly from electrical circuitry of the chip and are coupled to a plurality of metallic conducting pads positioned on the chip carrier immediately adjacent each edge thereof. The chip or the combination of the chip and the chip carrier may be hermetically sealed to form an integrated circuit chip carrier module wherein electrical connections extend from the conducting pads, hereinafter referred to as terminals, adjacent the edges of the module to the electrical circuitry of the chip.

Connector apparatus has been developed for use in mounting integrated circuit chip carrier modules on printed wiring circuit boards and interconnecting each of the module terminals with a portion of the board circuitry. Typically, the connector apparatus comprises an insulating base member in which are mounted electrical conducting members designed to press against the terminals of a module mounted on the base member and establish electrical connections between the module terminals and the printed wiring board circuitry.

In the past, such connector apparatus has generally included a one piece insulating base member having pockets or cavities located around the perimeter to hold electrical conducting members. Each electrical conducting member having a tail portion and a spring portion intended to engage a module terminal is inserted into a cavity such that the tail portion engages the base member to hold the electrical conducting member in place. The tail portion extends beneath the base member into a hole drilled through the printed wiring or circuit board so that the tail portion may be soldered to the circuitry of the circuit board.

A problem occurs in using this type of connector apparatus with multilayer circuit boards in that holes drilled in these types of boards may interfere with or damage various layers of circuitry. Other types of connector apparatus have been developed for use with circuit boards wherein the electrical conducting members each have a spring contact portion which may be soldered or forced into engagement with circuitry of the circuit board. These latter types of connector apparatus often are a problem in that the base member must be modified in a number of different ways to accommodate the electrical conducting members. For example, a base member may be required to be bolted to a circuit board to maintain the electrical conducting members in contact with the circuit board or may be modified by expensive and complicated techniques to locate the electrical conducting members within the base member so that they may be aligned with circuitry of the circuit board.

Accordingly, a need exists for easily manufactured apparatus for mounting multi-terminal integrated circuit modules on circuit boards. A need also exists for easily assembled connector apparatus having a plurality of aligned electrical conducting members for use in mounting a multi-terminal integrated circuit module on a circuit board and interconnecting the module terminals with printed wiring circuitry of the circuit board.

SUMMARY OF THE INVENTION

The foregoing problems are solved and a technical advance is achieved by module mounting apparatus having an assembling structure used to assemble insulating members and electrical conducting members to form quadrilateral configurations of first and second contacts of the electrical conducting members to contact terminals of a module and a circuit board and electrically couple the module with circuitry of the circuit board.

In accordance with the invention, an assembly for holding a module on a circuit board comprises conducting members having opposing first and second contacts for electrically coupling the module terminals with the circuit board. The assembly includes a first insulating member for receiving both the module and conducting members and aligning the first contacts thereof with corresponding module terminals. The assembly also includes a plurality of second insulating members for supporting the conducting members and aligning the second contacts of the conducting members with the circuit board. The assembly further includes a ring member for assembling the first and second insulating members to form quadrilateral configurations of the first and second contacts for contacting the module terminals and circuit board and a cover member for engaging the ring member to clamp the module onto the first insulating member and maintain the module terminals in engagement with the first contacts of the conducting members.

Also in accordance with the invention, an assembly for holding a module on a circuit board and interconnecting the module with the circuit board includes electrical conducting members each comprising a generally rectangular support section of resilient spring metal having one end formed through a reverse curve section into a cantilever spring defining a first contact for contacting a module terminal and the other end extended through a generally reverse z-shaped section to define a second contact opposed to the first contact for contacting the circuit board. Ones of the electrical conducting members are each attached at the second contact to a common carrier intended to align the second contacts of the electrical conducting members with circuitry of the circuit board. The common carrier is scored or crimped at the juncture of the common carrier with the electrical conducting members second contacts to enable the common carrier to be removed from the electrical conducting members after the second contacts thereof have been attached to the circuit board.

Also in accordance with the invention, an assembly for holding a module on a circuit board includes a generally rectangular member formed of electrical insulating material embodying quadrilateral members forming on one side a chamber for receiving the module and each having formed on the other side a plurality of aligned cavities. Each cavity is configured to receive a reverse curve section and cantilever spring of an electrical conducting member attached to a common carrier so as to position a first contact of the electrical conducting member in a slot formed in a quadrilateral member in alignment with a corresponding module terminal. Cornerpost sections joining adjacent quadrilateral members and located at each corner of the insulating member enable the insulating member to be assembled in combination with other insulating members in a ring structure to form quadrilateral configurations of first and second contacts of the electrical conducting members to contact the module terminals and the circuit board.

Also in accordance with the invention, an assembly for holding a module on a circuit board includes a plurality of generally rectangular members formed of insulating material with each having a raised rear section with a plurality of aligned curved indentions for supporting reverse curve sections of ones of a plurality of electrical conducting members having opposing first and second contacts. Each of the insulating members also have a front section with a plurality of aligned cavities each separated by a rib section formed for supporting a reverse z-shaped section and second contact of an electrical conducting member. The plurality of insulating members are assembled with a single insulating member by a ring member to form quadrilateral configurations of the first and second contacts of the electrical conducting members for contacting terminals of the module and the circuit board.

Also in accordance with the invention, an assembly for holding a module on a circuit board includes a generally rectangular ring member having vertical spring latching members and quadrilateral sections joined by corner sections. The quadrilateral members are formed for assembling a plurality of second insulating members arranged for supporting electrical conducting members and aligning second contacts thereof with the circuit board. The corner sections are formed for assembling a first insulating member in combination with the plurality of second insulating members to secure the electrical conducting members in module mounting apparatus to form quadrilateral configurations of opposing first and second contacts of the electrical conducting members. A cover engaging the vertical spring latching members clamps the module on the first insulating member and maintains each module terminal in electrical engagement with the first contacts of the electrical conducting members.

In further accordance with the invention, a one piece cover comprises a rectangular center section having a pair of cantilever springs and spring tab members at each corner thereof for engaging vertical spring latching members of a ring used to assemble a first insulating member in combination with a plurality of second insulating members having electrical conducting members positioned and secured therein. The engaging of the cover spring tab members with the vertical spring latching members of the ring enables the pair of cantilever springs to clamp a module onto the first insulating member and maintain terminals of the module in electrical engagement with a quadrilateral configuration of first contacts of the electrical conducting members which further have second contacts for contacting a circuit board.

DESCRIPTION OF THE DRAWING

The foregoing as well as other objects, features and advantages of the invention will be more apparent from a description of the drawing in which.

DESCRIPTION OF THE INVENTION

1. Apparatus Description

Figure 1:
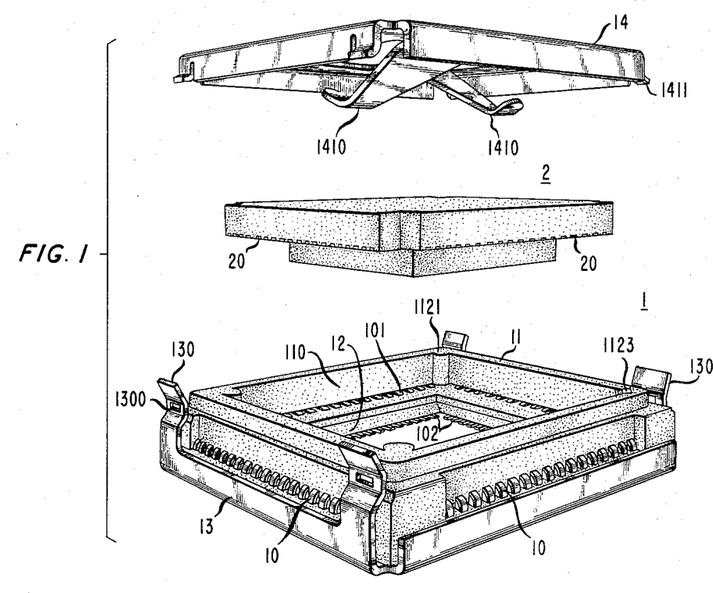
FIG. 1 is an axonometric view illustrating module mounting apparatus embodying the principles of the instant invention.

Referring to the drawing and more specifically to FIG. 1 of the drawing, module mounting assembly 1 set forth therein is intended for use in mounting module 2 on a printed wiring board. Module 2 generally comprises a small integrated circuit chip mounted on a ceramic chip carrier and is arranged such that the electrical circuitry of the chip is coupled by connecting leads to a plurality of metallic terminals 20 positioned about the perimeter of the chip carrier. Typically, the chip, or the combination of the chip, chip carrier and connecting leads, are heremetically sealed to form module 2 wherein electrical connections are made to the electrical circuitry of the chip through terminals 20 adjacent the edges of module 2.

Module mounting assembly 1 is designed to hold module 2 on a circuit board and interconnect module terminals 20, via electrical conducting members 10, with conducting paths of the circuit board. After assembly of the component parts, hereinafter described in detail, module mounting assembly 1 is positioned on a circuit board and electrical conducting members 10 thereof attached to the circuit board conducting paths. Module 2 is subsequently positioned with respect to insulating member 11 so that module terminals 20 are aligned with electrical conducting members 10. Cover 14 is placed over module 2 and engaged with ring member 13 to clamp module 2 onto insulating member 11 and maintain each module terminal 20 in electrical engagement with a corresponding one of electrical conducting members 10.

Figures 5, 6, 7:
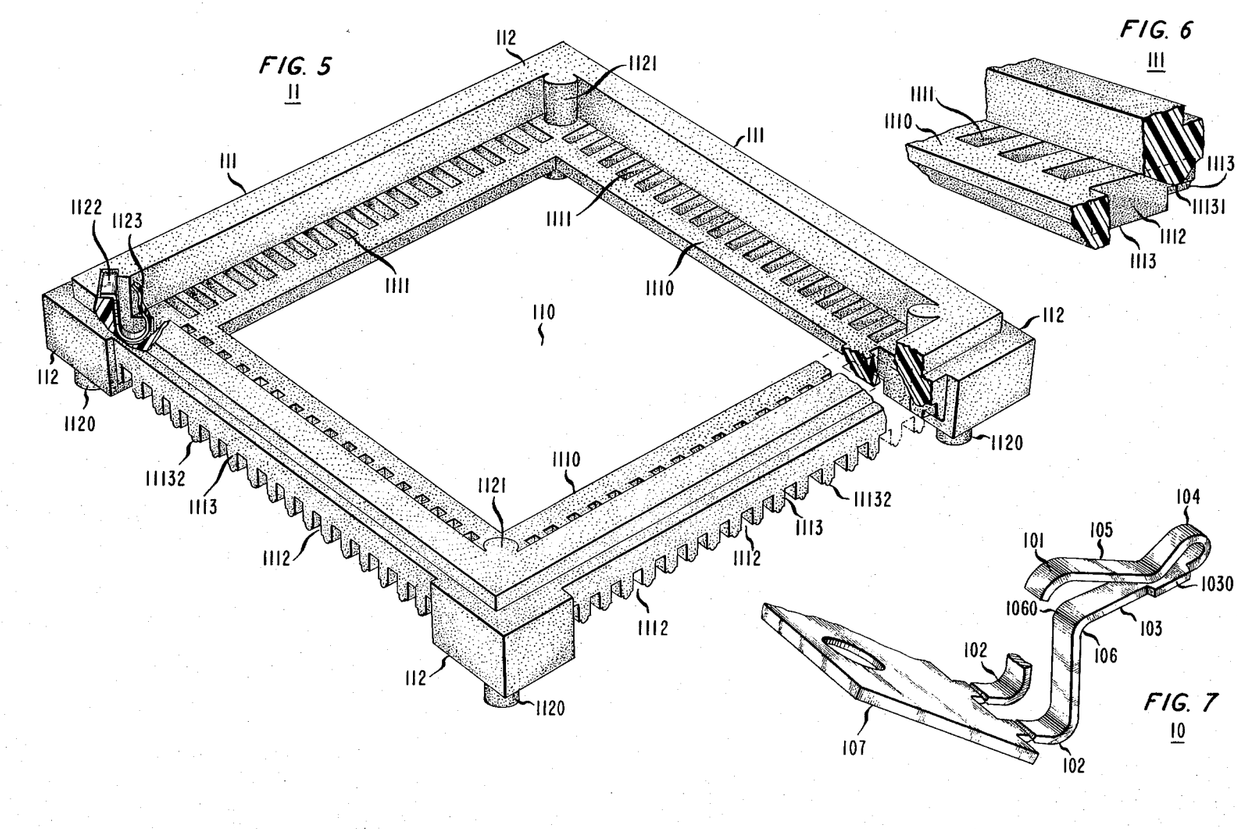
FIG. 5 an axonometric view of another insulating member of the module mounting apparatus of FIG. 1 formed for receiving a module and aligning first contacts of electrical conducting members with corresponding terminals of the module.
FIG. 6 is a fragmentary sectional axonometric view of a part of the insulating member set forth in FIG. 5.
FIG. 7 is an axonometric view illustrating one of a plurality of electrical conducting members of the instant module mounting apparatus attached to a common carrier.

Electrical conducting members 10, set forth in FIG. 7 of the drawing, are constructed of an electrical conducting resilient spring material such as a beryllium copper alloy. Each is formed from the resilient spring material and has a generally rectangular support section 103 with a pair of opposed tabs 1030 each extending outward from opposite sides thereof. One end of support section 103 is formed through a reverse curve section 104 slidably meeting the topside of support section 103 and extended into a cantilever spring 105 having a first contact 101 located at the free end thereof. The other end of support section 103 is formed through a right angle 1060 and extended downward to define a second contact 102 opposed to first contact 101. A common carrier 107 is attached at the second contact 102 portion to ones of electrical conducting members 10 and is scored or crimped at the juncture with electrical conducting members 10 to enable common carrier 107 to be removed after second contacts 102 have been affixed to a circuit board.

A part of support section 103 in combination with right angle 1060 and the extended portion thereof may be considered as a generally reverse z-shaped section 106 extension of support section 103 to define second contact 102. First and second contacts 101, 102 may be of a type of contact wherein a gold diffused alloy of palladium and silver is inlaid in the beryllium copper alloy or may be any other well known type of contact structure such as a layer of gold sputtered or electroplated onto the beryllium copper alloy.

Referring to FIG. 5 of the drawing, module mounting assembly 1 includes a first insulating member 11 formed to receive module 2 and electrical conducting members 10 such that a first contact 101 of each conducting member 10 is aligned with a corresponding terminal 20 of module 2. Insulating member 11 is a generally rectangular structure constructed of an electrical insulating material such as diallyl phthalata and has quadrilateral members 111 forming sides which are joined by cornerpost sections 112 to complete the structure.

Each quadrilateral member 111 has one side formed with a ledge 1110 having a row of slots 1111 intended to receive first contacts 101 of electrical conducting members 10. Adjacent quadrilateral members 111 are joined together by cornerpost sections 112 to form a chamber 110 for receiving module 2 so that the edges of module 2 lie on ledges 1110 with terminals 20 thereof aligned with corresponding ones of slots 1111.

The opposite sides of quadrilateral members 111 are formed with a plurality of cavities 1112 each configured as set forth in FIG. 6 of the drawing, to receive the reverse curve section 104 and cantilever spring 105 of an electrical conducting member 10 and position first contact 101 within a corresponding slot 1111. Rib sections 1113 separating cavities 1112 are formed with a rear surface 11131 intended to engage tabs 1030 and aid in securing electrical conducting members 10 within module mounting assembly 1. Spacing tabs 11132 located on rib surfaces 11131 serve to separate tabs 1030 of electrical conducting members 10 and thereby prevent an electrical short circuit from occurring between two adjacent electrical conducting members 10.

As set forth in FIG. 5 of the drawing, cornerpost sections 112 are configured so that the dimensions between the outer sides are slightly greater lengthwise than endwise thereby creating a generally irregular rectangular configuration enabling insulating member 11 to be aligned within module mounting assembly 1. Each cornerpost section 112 has a downward extending dowel 1120 dimensioned for aligning and enabling insulating member 11 to be assembled within module mounting assembly 1. Three cornerpost sections 112 each have a vertical alignment section 1121 formed at the intersection of two adjacent quadrilateral members 111 to enable alignment of module 2 with respect to chamber 110. The fourth cornerpost section 112 has a cavity 1122 with a biasing spring 1123 positioned therein. As set forth in detail in FIG. 11 of the drawing, cavity 1122 is located at the intersection of two adjacent quadrilateral members 111 and is formed with a shelf section extending downward into cornerpost section 112 and curved upward at the bottom to open one side into chamber 110. Biasing spring 1123 is a generally u-shaped spring member wherein one side has a serrated section 11231 extended and formed over at a right angle into a support section 11232 and wherein the opposite side is formed into a curved section 11233 for engaging module 2. Installation of biasing spring 1123 into cavity 1122 is such that support section 11232 is supported on the shelf section of cavity 1122 with serrated section 11231 engaged with the side thereof to located biasing spring 1123 in cavity 1122 and position the free curved section 11233 in chamber 110. During the sequence of installing module 2 in insulating member 11 curved section 11233 of biasing spring 1123 laterally biases module 2, FIG. 5, against vertical alignment sections 1121 to align module terminals 20 with corresponding ones of slots 1111.

Figure 3:
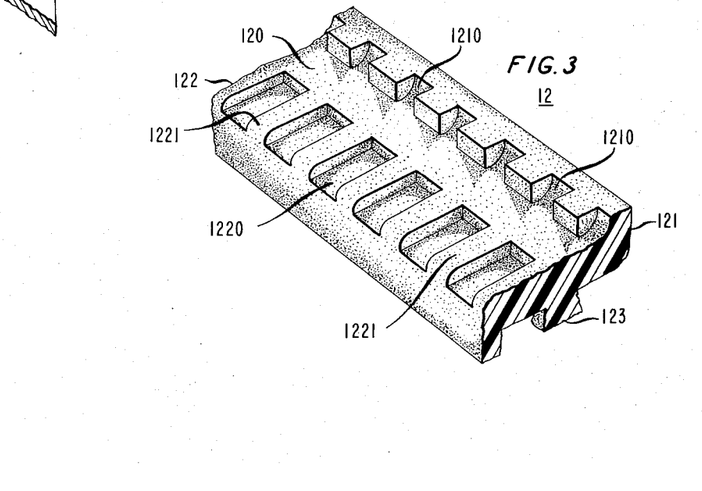
FIG. 3 is a fragmentary sectional axonometric view of one of a plurality of insulating members formed for supporting electrical conducting members of the module mounting apparatus of FIG. 1 and aligning contacts thereof with a circuit board.

In addition to insulating member 11, module mounting assembly 1 also includes four additional insulating members 12 intended to support electrical conducting members 10 and align second contacts 102 with circuitry of a circuit board. As set forth in FIG. 4 of the drawing, insulating members 12 each comprise a generally rectangular member formed of electrical insulating material such as diallyl phthalata. Each have a center section 120, FIG. 3, for supporting the support sections 103 and tabs 1030 of electrical conducting members 10 attached to common carrier 107. Each further have a raised rear section 121 with a plurality of aligned curved indentions 1210 formed to support the reverse curve section 104 of an electrical conducting member 10. A front section 122 has a plurality of aligned cavities 1220 each separated by a rib section 1221 aligned with a corresponding curved indention 1210 and which is formed to support the reverse z-section 106 of an electrical conducting member 10. Each insulating member 12 also has a plurality of aligned dowels 123 extending downward therefrom to aid in assembly.

Figure 2:
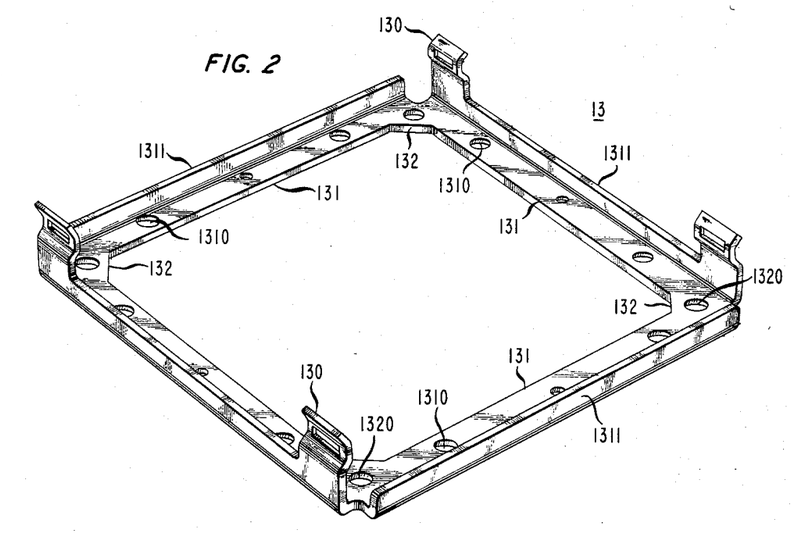
FIG. 2 is axonometric view of a ring member for assembling the component parts of the module mounting apparatus set forth in FIG. 1.

Module mounting assembly 1 also includes a ring member 13, FIG. 1, for use in assembling insulating member 11, electrical conducting members 10 and insulating members 12 to form quadrilateral configurations of first and second contacts 101, 102 for contacting module terminals 20 and a circuit board, respectively. As illustrated in FIG. 2 of the drawing, ring member 13 comprises a generally rectangular base member having vertical spring latching members 130 and quadrilateral sections 131 joined by corner sections 132. Each quadrilateral member 131 of ring member 13 is a planar rectangular section having a rear section 1311 positioned at a right angle with respect thereto. In addition, two opposing quadrilateral members 131 each have the ends of their respective rear section 1311 further extended and formed into vertical spring latching members 130. The planar rectangular sections of quadrilateral members 131 each have a number of aligned holes 1310 sized to receive a corresponding dowel 123 of an insulating member 12. Corner sections 132 each have a hole 1320 seized to receive a corresponding dowel 1120 of insulating member 11.

Figures 11, 12:
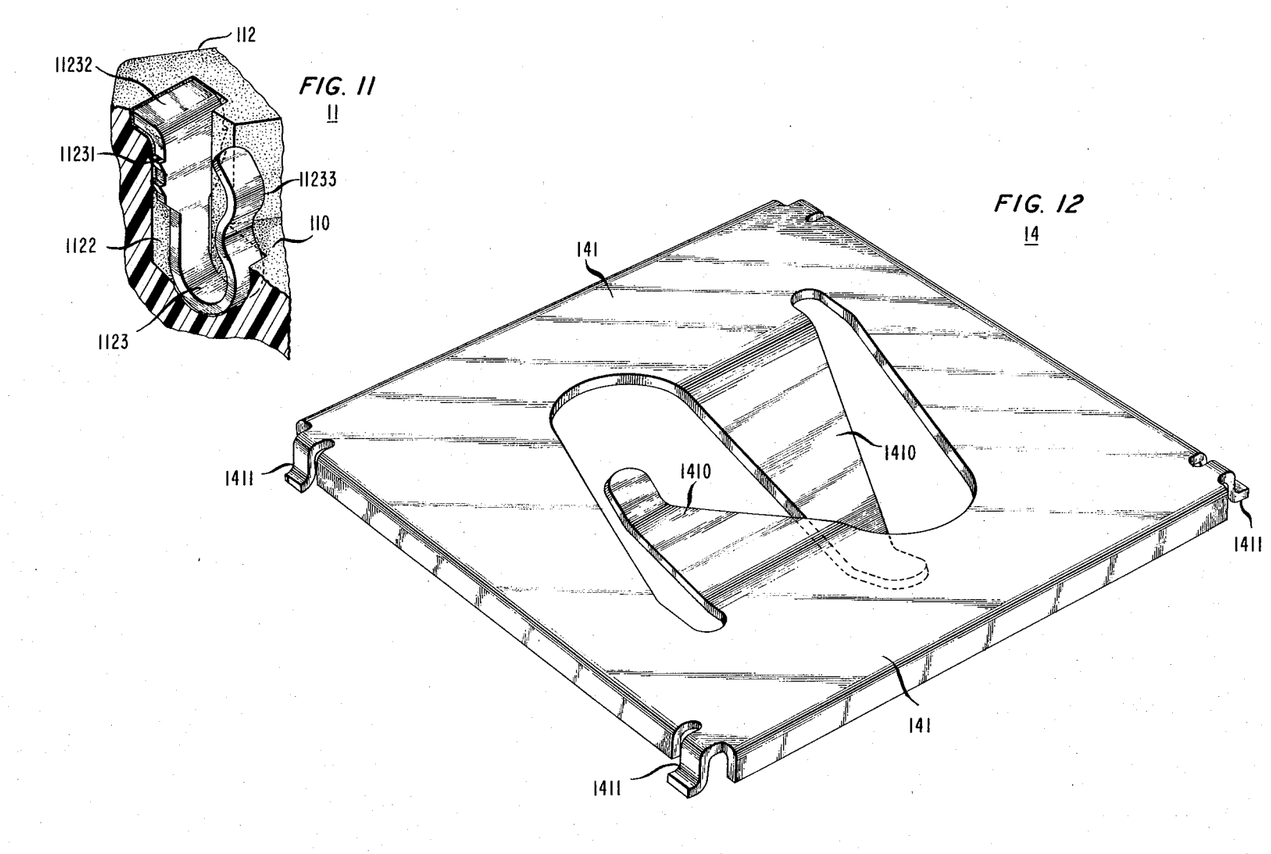
FIG. 11 is an axonometric view of a fragmentary section of a cavity formed in the insulating member set forth in FIG. 5 with a module biasing spring member positioned therein.
FIG. 12 is an axonometric view of a one piece cover intended to engage the ring member set forth in FIG. 2 and spring clamp a module on the module mounting assembly of FIG. 1.

Referring now to FIG. 12 of the drawing, module mounting assembly 1 also includes a one piece cover 14 having a rectangular center section 141 provided with a pair of downward extending cantilever springs 1410. In addition, two opposing sides of cover 14 have spring tabs 1411 formed at the ends thereof to engage corresponding vertical spring latching members 130 of ring member 13. The outer edges of center section 141 are formed at a right angle to center section 141 to strengthen cover member 14.

2. Assembly

Figure 4:
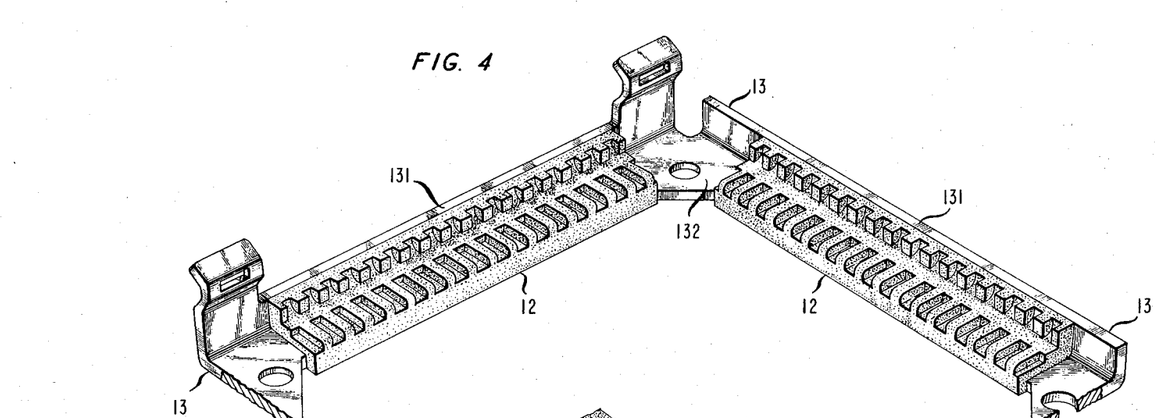
FIG. 4 is a fragmentary axonometric view of several of the insulating members of FIG. 3 mounted on the ring member of FIG. 2.

In assembling module mounting assembly 1 each insulating member 12, FIG. 4 of the drawing, is aligned with a ring quadrilateral member 131 and dowels 123 inserted into aligned holes 1310 so that insulating member 12 is properly positioned on ring member 13. Dowels 123 may be heatstaked or bonded in any of a number of well-known ways to secure insulating members 12 to ring member 13.

Figure 10:
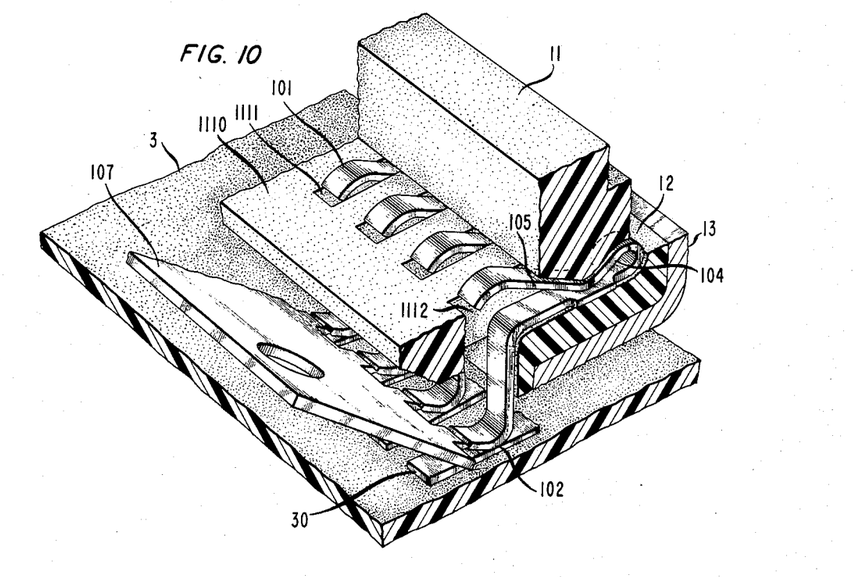
FIG. 10 is an axonometric view of a fragmentary section of the insulating and electrical conducting members of FIGS. 3, 5 and 7 with the electrical conducting members attached to a circuit board.

A strip of electrical conducting members 10 attached to a single common carrier 107, FIG. 10, are simultaneously inserted into cavities 1112 of quadrilateral members 111 of insulating member 11 with reverse curve section 104 and cantilever spring 105 of each electrical conducting member 10 located with a cavity 1112 such that the first contact 101 thereof is positioned within a corresponding slot 1111 to normally extend slightly above the surface of ledge 1110.

Insulating member 11 with strips of electrical conducting members 10 inserted in cavities 1112 is positioned with respect to ring member 13 and the insulating members 12 mounted thereon so that corner sections 132, FIG. 2 of ring 13, correspond with cornerpost sections 112, FIG. 5. Dowels 1120 extending downward from cornerpost sections 112 are inserted into holes 1320 of ring member 13 and insulating member 11 forced downward onto ring member 13 so that cornerpost sections 1120 rest on the corner sections 132.

Figures 8, 9:
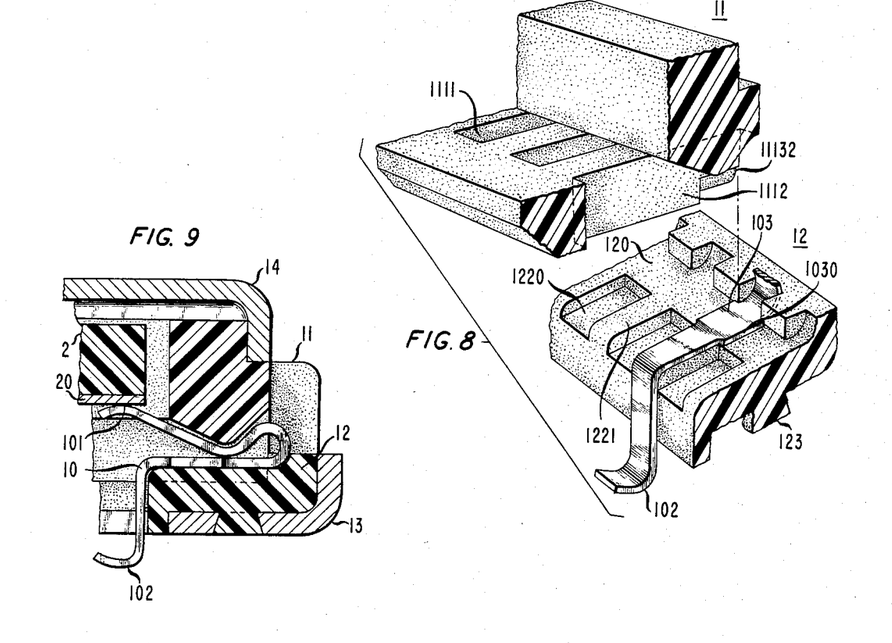
FIG. 8 is an exploded fragmentary axonometric view illustrating assembly of the insulating members and electrical conducting members of FIGS. 3, 5 and 7.
FIG. 9 is a fragmentary sectional view of the insulating and electrical conducting members of FIG. 8 assembled to form the module mounting apparatus set forth in FIG. 1.

As insulating member 11 is forced onto ring member 13, FIG. 8, support section 103 of each electrical conducting member 10 comes in contact with center section 120 of insulating members 12 thereby enabling support section 103 to be supported within module mounting assembly 1 by rib section 1221. When insulating member 11 is assembled in combination with insulating members 12, spacing tabs 11132 come in contact with center surface 120 to insure separation of tabs 1030 and electrically insulate adjacent electrical conducting members 10. The reverse curve end cantilever configuration of cavities 1112 engage the corresponding sections of electrical conducting members 10 and in combination with insulating members 12 secure electrical conducting members 10 within module mounting assembly 1. Upon assembly of insulating members 11 and 12 on ring 13 each are positioned with respect to the other, FIG. 10, such that a position of reverse curve section 104 of each electrical conducting member 10 is exposed to provide test access to circuitry of module 2 through first contact 101 and to circuit board 3 through second contact 102.

Ring member 13, and the assembled insulating members 11, 12 and electrical conducting members 10 are positioned on circuit board 3 such that each second contact 102 corresponds with a land 30 of the printed wiring circuitry. After second contacts 102 have been soldered either by the well-known reflow soldering method to lands 30, common carriers 107 are removed at the crimped juncture with second contacts 102 from module mounting assembly 1 to electrically isolate conducting members 10.

As set forth in FIG. 1 of the drawing, module 2 is aligned with vertical alignment sections 1121 of insulating member 11 and inserted into chamber 110 thereof. Biasing spring 1123 laterally biases module 2 against vertical alignment sections 1121 with each module terminal 20 corresponding to an electrical conducting member first contact 101. Cover 14 is then aligned with ring member 13 and forced down on module mounting assembly 1 and module 2 to engage spring tabs 1411 within slots 1300 of ring vertical spring latching members 130. Cantilever springs 1410 clamp module 2 onto module mounting assembly 1, and FIG. 9, maintains each module terminal 20 in electrical engagement with first contact 101 of electrical conducting member 10. An electrical path is established from module terminal 20 through first contact 101 and electrical conducting member 10 to second contact 102. Cover 14 is engaged with ring member 13 and the outer edges thereof supported by an edge around the perimeter of insulating member 11 to form a shroud to shield and protect module 2.

SUMMARY

It is obvious from the foregoing that the facility, economy and efficiency of mounting integrated circuit modules on printed wiring circuit boards may be substantially enhanced by easily assembled module mounting apparatus. It is further obvious from the foregoing that a ring member used for assembling component parts of a module mounting assembly to form quadrilateral configurations of electrical conducting member contacts facilitates the manufacture of module mounting apparatus for mounting integrated circuit modules on printed wiring circuit boards.

What is claimed is:

1. Apparatus for mounting a module with terminals on a circuit board, said apparatus comprising
    an assembly (1) for holding the module (2) and interconnecting the terminals (20) thereof with the circuit board (3) characterized in that said assembly comprises
    conducting members (10) having opposing first and second contacts (101, 102) for electrically coupling the module terminals with the circuit board, means (11) having a chamber on one side for receiving the module and a plurality of cavities on the opposite side for recieving said conducting members and aligning each said first contact with a coresponding module terminal, means (12) for supporting said conducting members and aligning each said second contact with the circuit board, means (13) for assembling a plurality of said supporting means positioned thereon in combination with said receiving means and said conducting members to form quadrilateral configurations of said first contacts for contacting the module terminals and said second contacts for contacting the circuit board, and means (14) for engaging said assembling means and clamping the module in said chamber on said receiving means to maintain the module terminals in electrical engagement with said first contacts.

2. The module mounting apparatus of claim 1 characterized in that said conducting members each comprise a generally rectangular support section (103) having one end formed through a reverse curve section (104) into a cantilever spring (105) defining said first contact and the opposite end formed through a right angle (1060) extended to define said second contact opposite said first contact.

3. The module mounting apparatus of claim 2 characterized in that said receiving means comprises a generally rectangular insulating member (11) having said chamber (110) formed on one side for receiving the module and said plurality of cavities (1112) formed on the other side wherein each cavity is configured for receiving said reverse curve section and cantilever spring of said conducting members to position said first contact in a slot (1111) formed in the base of said chamber in alignment with a corresponding terminal of the module.

4. The module mounting apparatus of claim 3 characterized in that said supporting means comprises a generally rectangular insulating member (12) having a rear section (121) with a plurality of aligned indentions (1210) for supporting said conducting member reverse curve sections and a front section (122) with a plurality of cavities (1220) separated by rib sections (1221) for supporting said extended right angle ends of said conducting members.

5. The module mounting apparatus of claim 4 characterized in that said assembling means comprises a ring member (13) for mounting said plurality of supporting insulating members in combination with said insulating receiving member to secure said conducting members in the module mounting apparatus.

6. The module mounting apparatus of claim 5 characterized in that said engaging and clamping means comprises a one piece cover (14) having a center section (141) with cantilever spring means (1410) and spring tab members (1411) for engaging said ring member and enabling said cantilever spring means to spring clamp the module in said receiving means chamber.

7. Apparatus for mounting a module with terminals on a circuit board, said apparatus comprising an assembly (1) for holding the module (2) and interconnecting the terminals (20) thereof with the circuit board (3) characterized in that said assembly comprises electrical conducting members (10) having opposing first and second contacts (101, 102) for coupling the module terminals with the circuit board, 2 first insulating means (11) having a chamber on one side for receiving the module and a plurality of cavities on the opposite side for receiving said electrical conducting members and aligning each said first contact with a corresponding module terminal, second insulating means (12) for supporting said electrical conducting members and aligning each said second contact with the circuit board, means (13) for assembling a plurality of said second insulating members positioned thereon in combination with said first insulating means and said electrical conducting members to form quadrilateral configurations of said first contacts for contacting the module terminals and said second contacts for contacting the circuit board, and means (14) for engaging said assembling means and spring clamping the module in said first insulating means chamber to maintain each module terminal in electrical engagement with a corresponding one of said first contacts.

8. The module mounting apparatus of claim 7 characterized in that said electrical conducting members each comprise a generally rectangular support section (103) of resilient spring metal having one end formed through a reverse curve section (104) into a cantilever spring (105) defining said first contact and the opposite end extended and formed through a generally reverse z-shaped section (106) to define said second contact opposite said first contact.

9. The module mounting apparatus of claim 8 characterized in that said first insulating means comprises a generally rectangular first member (11) of electrical insulating material embodying quadrilateral members (111) each having one side formed with a ledge (1110) containing a row of slots (1111) formed therein for receiving one edge of the module with each module terminal aligned with one of said slots and the opposite side formed with a plurality of cavities (1112) each configured for receiving said reverse curve section and cantilever spring of one of said electrical conducting members to position said first contact in a corresponding one of said slots.

10. The module mounting apparatus of claim 9 characterized in that said second insulating means comprises a generally rectangular second member (12) formed of electrical insulating material having a raised rear section (121) with a plurality of aligned curved indentions (1210) for supporting said electrical conducting member reverse curve section and a front section (122) with a plurality of aligned cavities (1220) each separated by a rib section (1221) for supporting said reverse z-shaped section of said electrical conducting members.

11. The module mounting apparatus of claim 10 characterized in that said assembling means comprises a ring member (13) for mounting said plurality of second insulating members in combination with said first insulating member to secure said electrical conducting members within the module mounting apparatus to form said quadrilateral configurations of said first and second contacts.

12. The module mounting apparatus of claim 11 characterized in that
first insulating member comprises cornerpost sections (112) each having a dowel (1120) extending downward therefrom and each dimensioned for aligning said first insulating member with said ring member.

13. The module mounting apparatus of claim 12 characterized in that
each of said second insulating members comprises a plurality of aligned dowels (123) extending downward therefrom for securing said second insulating members to said ring member.

14. The module mounting apparatus of claim 13 characterized in that
said ring member comprises a base member with vertical spring latching members (130) and quadrilateral sections (131) joined by corner sections (132), said quadrilateral sections each having aligned holes (1310) sized for receiving said aligned dowels of one of said second insulating members to secure said one second insulating member thereto and said corner sections each having a hole (1320) sized for receiving one of said dowels of said first insulating member to secure said first insulating member to said ring member.

15. The module mounting apparatus of claim 14 characterized in that
said ring member quadrilateral and corner sections are dimensioned for assembling said first insulating member with respect to said plurality of said second insulating members to secure said electrical conducting members in said module mounting apparatus and expose a portion of each electrical conducting member reverse curve section for providing test access to each said electrical conducting member.

16. The module mounting apparatus of claim 15 characterized in that
said engaging and clamping means comprises a one piece cover (14) having a rectangular center section (141) with a pair of cantilever springs (1410) and spring tab members (1411) at each corner thereof for engaging corresponding ones of said base member vertical spring latching members and enabling said cantilever springs to clamp the module onto said first insulating member with the module terminals in engagement with said electrical conducting members first contacts.

17. The module mounting apparatus of claim 16 characterized in that
a plurality of said first insulating members cornerpost sections each have a vertical alignment section (1121) formed at the intersection of two of said quadrilateral members for aligning the module with respect to said first insulating member, and
one of said first insulating member cornerpost sections has a cavity (1122) with a generally u-shaped spring member (1123) positioned therein for biasing the module against said vertical alignment sections to align the module terminals with corresponding ones of said slots and first contacts.

18. The module mounting apparatus of claim 17 characterized in that
said electrical conducting members each have a pair of opposed tabs (1030) extending outward from the center of said rectangular support section thereof for supporting each said electrical conducting member on one of said second insulating members, and
said first insulating member comprises a spacing tab (11131) formed on each rib section separating said electrical conducting member receiving cavities for electrically insulating adjacent ones of said electrical conducting member tabs.

19. Apparatus for mounting a module with terminals on a circuit board, said apparatus comprising
an assembly (1) for holding the module (2) and interconnecting the terminals (20) thereof with the circuit board (3) characterized in that said assembly comprises
electric conducting members (10) each having a generally rectangular support section (103) with one end formed through a reversed curve section (104) into a cantilever spring (105) defining a first contact (101) for contacting a module terminal and the opposite end extended through a right angle section (1060) extending to define a second contact (102) opposite said first contact for contacting the circuit board,
a first insulating member (11) having a chamber (110) formed on one side for receiving the module and a plurality of cavities (1112) formed on the opposite side thereof each configured or receiving said reverse curve section and cantilever spring of said electrical conducting members to align said first contacts thereof with the module terminals,
a plurality of second insulating members (12) each having a plurality of aligned indentions (1210) for supporting said electrical conducting member reverse curve sections and a plurality of rib sections (1221) each corresponding to and aligned with a corresponding one of said indentions for supporting said extended right angle sections of said electrical conducting members,
a ring member (13) for assembling said plurality of second insulating members positioned thereon in combination with said first insulating member and said electrical conducting members to form quadrilateral configurations of said first and second contacts, and
cover means (14) for engaging said ring member and spring clamping the module into said first insulating member chamber to maintain each module terminal in electrical engagement with a corresponding one of said first contacts.

20. The module mounting apparatus of claim 19 characterized in that
said electrical conducting members comprise a plurality of electrical conducting elements (10) formed of resilient spring metal and each attached at said second contact to a common carrier (107) for aligning said second contacts with the circuit board.

21. The module mounting apparatus of claim 20 characterized in that
said electrical conducting elements and attached common carrier are positioned in said first insulating member and assembled in combination with said second insulating members within said ring member to form said quadrilateral configurations of first and second contacts.

22. The module mounting apparatus of claim 21 characterized in that
said common carrier is crimped at the juncture with said electrical conducting element second contacts for enabling said common carrier to be removed from said electrical conducting elements after said second contacts thereof have been attached to the circuit board.

23. Apparatus for mounting a module with terminals on a circuit board, said apparatus comprising
an assembly (1) for holding the module (2) and interconnecting the terminals (20) thereof with the circuit board (3) characterized in that said assembly comprises
a plurality of electrical conducting elements (10) each having a generally rectangular support section (103) with one end formed through a reversed curve section (104) into a cantilever spring (105) defining a first contact (101) for contacting a module terminal and the opposite end extended through a right angle section (1060) extended to define a second contact (102) opposite said first contact for contacting the circuit board, said second contact attached to carrier strips (107) common to ones of said electrical conducting elements;
a first insulating member (11) having a chamber (110) formed on one side for receiving the module and a plurality of cavities (1112) formed on the opposite side for receiving ones of said electrical conducting elements attached to said carrier strips, said first insulating member cavitie each configured for receiving said reverse curve section and cantilever spring of one of said electrical conducting elements to align said first contact thereof with a corresponding module terminal;
a plurality of second insulating members (12) each having a plurality of aligned indentions (1210) for supporting said electrical conducting element reverse curve sections and a plurality of rib sections each corresponding to and aligned with a corresponding one of said indentions for supporting said extended right angle sections of ones of said electrical conducting elements attached to one of said carrier strips;
a ring member (13) for assembling said plurality of second insulating members positioned thereon in combination with said first insulating member and said electrical conducting elements to form quadrilateral configurations of said first and second contacts and for enabling said carrier strips to be removed from said electrical conducting elements after said second contacts thereof have been soldered to the circuit board, and
a cover (14) having a center section (141) with a pair of cantilever spring members (1410) extending downward therefrom and having spring tab members (1411) extending outward therefrom for engaging said ring member and enabling said pair of cantilever spring members to clamp the module in said first insulating member chamber and maintain the module terminals in engagement with corresponding ones of said first contacts.

24. Apparatus for mounting a module with terminals on a circuit board, said apparatus comprising
a plurality of electrical conducting elements each having opposing first and second contacts for coupling the module terminals with the circuit board,
a first insulating member having a chamber on one side for receiving the module and a plurality of cavities on the opposite side for receiving said electrical conducting elements and aligning each said first contact thereof with a corresponding module terminal,
a plurality of second insulating members for supporting ones of said electrical conducting elements positioned in said first insulating member,
a ring member for assembling said plurality of second insulating members positioned thereon in combination with said first insulating member to form quadrilateral configurations of said first contacts for contacting the module terminals and said second contacts for contacting the circuit board, and
a cover having a center section with a plurality of spring tab members and a pair of cantilever spring members for engaging said ring member and clamping the module in said first insulating member chamber to maintain the module terminals in engagement with corresponding ones of said first contacts.

25. The module mounting apparatus set forth in claim 24
wherein ones of said plurality of electrical conducting elements are each attached at said second contact to a common carrier for aligning said second contacts with the circuit board in preparation for attaching said second contacts thereto, and
wherein said first insulating member comprises a generally rectangular member having said chamber formed on one side for receiving the module and said plurality of cavities formed on the opposite side along the edges thereof for receiving ones of said electrical conducting elements and said common carrier attached thereto.

26. The module mounting apparatus set forth in claim 25
wherein said ring member comprises quadrilateral sections for mounting said second insulation members thereon and corner sections joining said quadrilateral sections for mounting said first insulating member in combination with said plurality of said second insulating members to secure said electrical conducting elements and attached common carriers within the module mounting apparatus, and
wherein said ring member corner sections each comprise a vertical spring latching member for engaging a corresponding one of said cover spring tab members.

27. The module mounting apparatus set forth in claim 26
wherein said common carriers are positioned in the module mounting apparatus and crimped at the juncture with ones of said electrical conducting elements for enabling removal of said common carriers from said electrical conducting elements after said second contacts thereof have been attached to the circuit board.

28. Apparatus for mounting a module with terminals on a circuit board, said apparatus comprising
an assembly (1) for holding the module (2) and interconnecting the terminals (20) thereof with the circuit board (3) characterized in that said assembly comprises
electrical conducting members (10) each having a first contact (101) for contacting a module terminal and a second contact (102) attached to a common carrier (107) and formed opposite said first contact for contacting the circuit board,
a first insulating member (11) having a chamber (110) on one side for receiving the module and having a plurality of cavities (1112) formed on the side opposite said chamber for receiving ones of said electrical conducting members attached to common carriers and aligning each said first contact with a corresponding module terminal, a plurality of second insulating members (12) for supporting said second contacts and said attached common carriers and aligning said second contacts with the circuit board, a ring member (13) for receiving said second insulating members and for assembling said second insulating members positioned thereon in combination with said first insulating member and electrical conducting members with attached common carriers to form quadrilateral configurations of said first contacts for contacting the module terminals and said second contacts for contacting the circuit board, and a cover (14) for engaging said ring member and clamping the module in said chamber of said first insulating member to maintain the module terminals in electrical engagement with said first contacts.

29. Apparatus for mounting a module with terminals on a circuit board, said apparatus comprising an assembly (1) for holding the module (2) and interconnecting the terminals (20) thereof with the circuit board (3) characterized in that said assembly comprises a plurality of electrical conducting members (10) each having a support section (103) with one end formed through a reverse curve section (104) into a cantilever spring (105) defining a first contact (101) for contacting a module terminal and the opposite end formed through a right angle section (1060) extended to define a second contact (102) attached at the end thereof to a carrier strip (107) and opposite said first contact for contacting the circuit board, a first insulating member (11) having quadrilateral members (111) each having one side formed with a ledge (1110) having a row of slots to form a chamber (110) for receiving the module and the opposite side formed with a plurality of cavities (1112) each configured for receiving one of said electrical conducting members attached to said carrier strips to position said first contact thereof in a corresponding one of said slots, a plurality of second insulating members (12) each having a rear section (121) with a plurality of aligned indentions (1210) for supporting said electrical conducting member reverse curve sections and a front section (122) having rib sections (1221) for supporting said extended right angle sections and carrier strips of said electrical conducting members, a rectangular ring member (13) having quadrilateral members (131) for receiving said second insulating members and for assembling said second insulating members positioned thereon in combination with said first insulating member and electrical conducting members with attached common carriers to form quadrilateral configurations of said first contacts for contacting the module terminals and said second contacts for contacting the circuit board, and a cover (14) for engaging said rectangular ring member and clamping the module in said chamber of said first insulating member to maintain each module terminal in electrical engagement with a corresponding one of said first contacts.

30. Apparatus for mounting a module with terminals on a circuit board, said apparatus comprising an assembly (1) for holding the module (2) and interconnecting the terminals (20) thereof with the circuit board (3) characterized in that said assembly comprises a plurality of electrical conducting members (10) each having a support section (103) of resilent spring metal with one end formed through a reverse curve section (104) into a cantilever spring (105) defining a first contact (101) for contacting a module terminal and the opposite end formed through a right angle section (1060) extended to define a second contact (102) attached at the end thereof to a carrier strip (107) and opposite said first contact for contacting the circuit board, a first insulating member (11) having cornerpost sections (112) interconnecting quadrilateral members (111) having one side formed with a ledge (1110) having a row of slots to form a chamber (110) for receiving the module and the opposite side formed with a plurality of cavities (1112) each configured for receiving one of said electrical conducting members attached to said carrier strips to position said first contact thereof in a corresponding one of said slots in alignment with a module terminal, a plurality of second insulating members (12) each having a plurality of dowels (123) extending downward therefrom and each having a rear section (121) for supporting said electrical conducting member reverse curve sections and a front section (122) having rib sections (1221) for supporting said extended right angle sections and carrier strips of said electrical conducting members, a rectangular ring member (13) having quadrilateral sections (131) with aligned holes for receiving said second insulating member dowels and joined by corner sections (132) for receiving said first insulating member cornerpost sections to assemble said first insulating member and electrical conducting members with attached common carriers in combination with said plurality of second insulating members to form quadrilateral configurations of said first contacts (101) for contacting module terminals and said second contacts (102) for contacting the circuit board, and a rectangular cover (14) for engaging said rectangular ring member and clamping the module in said chamber of said first insulating member to maintain each module terminal in electrical contact with a corresponding one of said first contacts.

* * * * *